United States Patent [19]

Holt, Jr.

[11] Patent Number: 4,521,917

[45] Date of Patent: Jun. 4, 1985

[54] NOISE BLANKING CIRCUIT AND METHOD

[75] Inventor: John R. Holt, Jr., Rustburg, Va.

[73] Assignee: General Electric Company, Lynchburg, Va.

[21] Appl. No.: 551,401

[22] Filed: Nov. 14, 1983

[51] Int. Cl.³ .............................................. H04B 1/10
[52] U.S. Cl. .................................... 455/223; 328/165; 455/225
[58] Field of Search ............... 455/212, 222, 223, 224, 455/225, 218, 296, 303, 311; 328/165

[56] References Cited

U.S. PATENT DOCUMENTS

| 3,978,412 | 8/1976 | Frerking | 455/222 |
| 4,114,105 | 9/1978 | Duncan | 455/223 |
| 4,327,446 | 4/1982 | Dressler | 455/223 |

FOREIGN PATENT DOCUMENTS 658747  4/1979  U.S.S.R. ............................... 455/223

Primary Examiner—Marc E. Bookbinder
Attorney, Agent, or Firm—James J. Williams; Robert C. Lampe, Jr.

[57] ABSTRACT

Noise blanking is provided by amplifying, limiting and detecting received signals. The detected signals are compared with a threshold circuit. The leading edge of each detected signal that rises at a rate greater than a selected rate to exceed an amplitude threshold level produces a blanking pulse of selected time duration. Low as well as high level noise signals are blanked. Slow rising information signals are not blanked, and fast rising information signals of high level are blanked initially for the selected time duration, but are not blanked thereafter.

7 Claims, 2 Drawing Figures

4,521,917

NOISE BLANKING CIRCUIT AND METHOD

BACKGROUND OF THE INVENTION

My invention relates to a noise blanking circuit and method, and particularly to such a circuit and method that provides a signal that blanks received signals for a wide amplitude range of noise, and that permits strong information signals to remain unblanked.

Noise blankers are used in communications systems, particularly radio communications systems, to eliminate bursts of noise, such as caused by natural or man-made bursts of electromagnetic energy. Even though they may be of short time duration, such bursts of noise are annoying or distracting to a user, particularly in a radio communications system. Prior art noise blankers I am aware of have several disadvantages. One disadvantage is that they are limited in the noise level or amplitude they respond to, with the result that some lower levels of noise may not be blanked. Another disadvantage is that they may blank high levels of information signals, thus causing information to be lost.

SUMMARY OF THE INVENTION

Briefly, in accordance with my invention, I provide a noise blanker that amplifies the received signals, and then limits the amplitude of these amplified signals to a selected level. This insures that low levels of noise will be effectively blanked. The amplitude-limited signals are then detected by an envelope or amplitude detector. If these detected signals rise faster than a selected rate and exceed a selected threshold or reference voltage change, an output signal is produced in response to the leading edge of the detected signals. This output signal is used to provide a blanking pulse of selected time duration. The time duration is selected to blank the average length of noise bursts. This blanking pulse is used to blank or prevent utilization of the received signal in the communications system, and thus spare the user from the effects of the burst of noise. If a strong information signal is received, it may be blanked for the selected time duration of the blanking pulse, but will be heard thereafter as long as it exceeds the threshold level.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

DESCRIPTION OF THE PREFERRED EMBODIMENT

Figure 1:
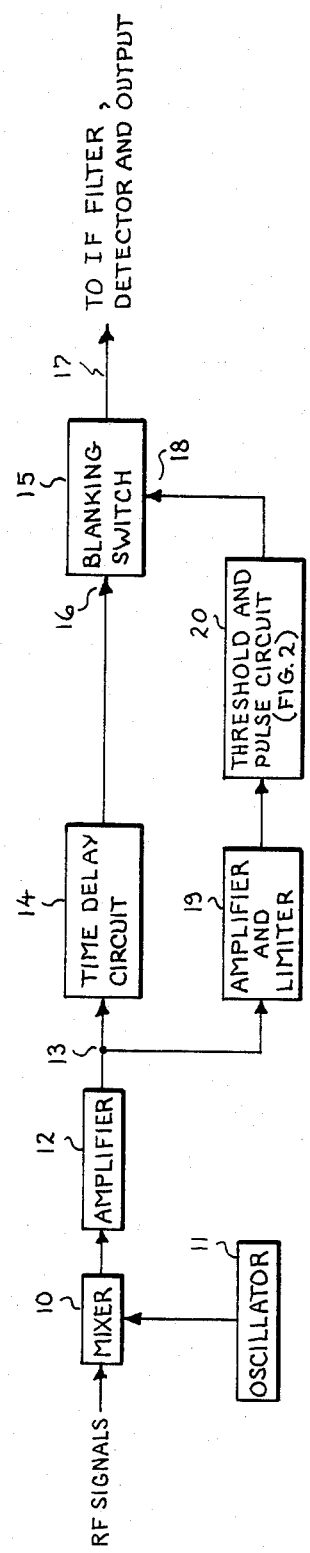
FIG. 1 shows a block diagram of a typical application of a noise blanker circuit in accordance with my invention.

As an example, I have assumed that my noise blanking circuit is used in a radio communications receiver. However, persons skilled in the art will appreciate that my noise blanking circuit can be used in other applications which receive radio frequency signals that are subject to noise. As shown in FIG. 1, the radio frequency signals are received from an antenna or wire, and may be amplified. The signals are then applied to a mixer 10 which combines the received signals with locally produced signals from an oscillator 11 to produce signals of a suitable intermediate frequency. These intermediate frequency signals may be amplified by an amplifier 12 and supplied at an output terminal 13. The signals at the output terminal 13 containing information, and noise when it occurs, are applied to two paths.

The first path comprises a time delay circuit 14 which provides a suitable time delay that introduces as little phase distortion and spreading of the intermediate frequency signal as possible. The time delay provided by the circuit 14 is sufficient to permit the blanking pulse to be produced by the second path of the noise blanking circuit in accordance with my invention. The delayed signal is applied to the input 16 of a blanking switch 15 which is preferably of a fast operating electronic type. The blanking switch 15 passes these signals to its output 17 in the absence of a blanking pulse applied to its control input 18, and blanks or blocks these signals in the presence of a blanking pulse at the control input 18.

The second path comprises an amplifier and limiter circuit 19 which provides suitable amplitude amplification of the signals at the terminal 13, and then limits the amplifier signals to a selected or predetermined level. The amplified and limited signals, containing the intermediate frequencies, are then applied to my blanking pulse circuit 20 which responds to the amplitude and rate of rise of the amplified and limited signals to produce a blanking pulse. As will be explained, a blanking pulse is produced in response to limited signals which rise faster than a selected rate and exceed a threshold or reference amount of voltage change. The blanking pulse has a predetermined time duration.

The blanking pulse from the circuit 20 is applied to the control input 18 of the blanking switch 15. This blanking pulse prevents the blanking switch 15 from passing signals at its input terminal 16, so that no signals are supplied to its output terminal 17 during the blanking pulse period. By proper selection of the time delay of the time delay circuit 14, a noise signal arrives at the input 16 of the switch 15 at the same time as the blanking pulse so that the noise is effectively eliminated. Unblanked signals from the output terminal 17 are applied to the remainder of the receiver, which may include an intermediate frequency filter, a detector (either amplitude or frequency), and an output circuit. Details of these circuits are not shown, since they are well known in the art, and may take many forms.

Figure 2:
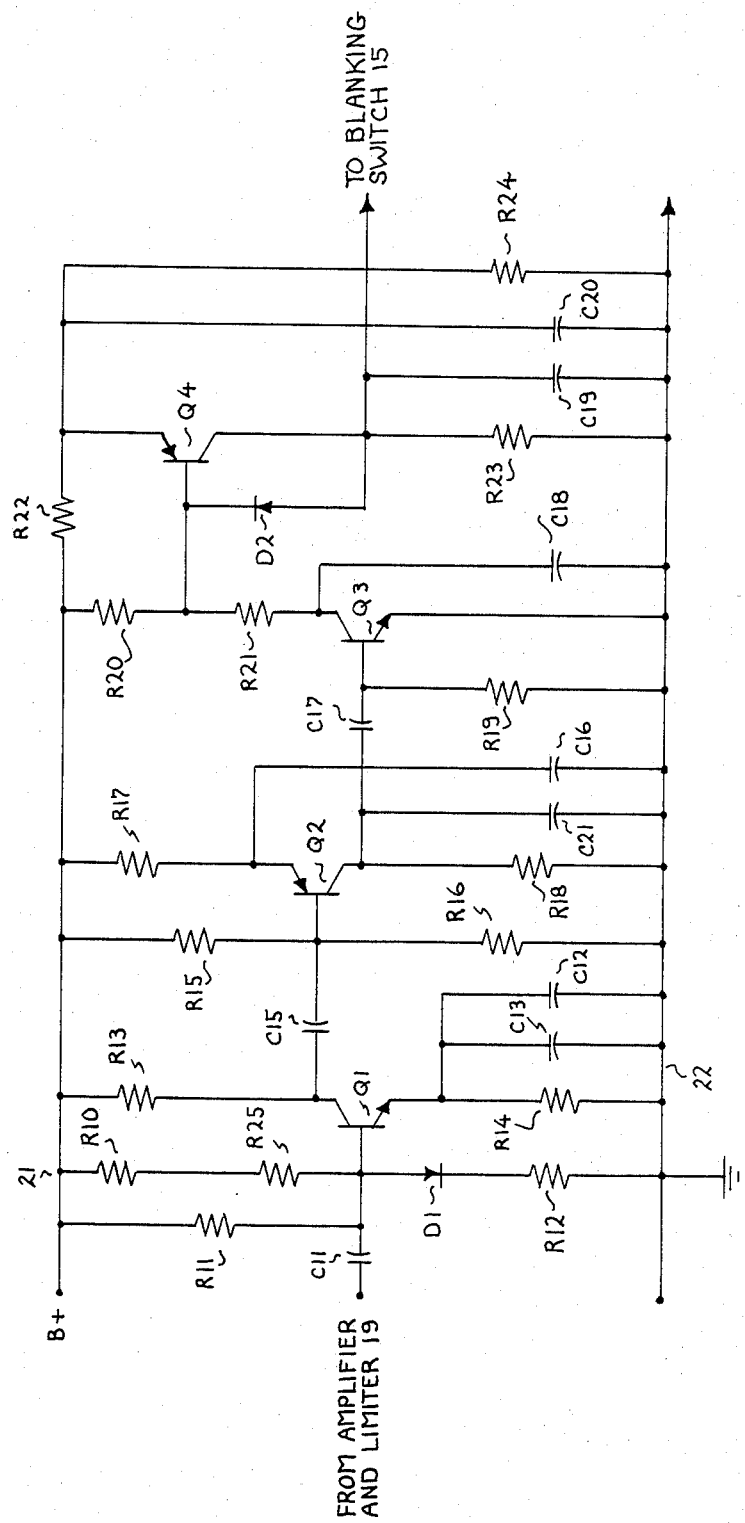
FIG. 2 shows a preferred schematic diagram of a circuit for producing a noise blanking pulse in accordance with my invention.

FIG. 2 shows a preferred schematic diagram of the blanking pulse circuit 20 of my invention. The circuit of FIG. 2 includes a suitable source of direct current positive voltage B+ that is applied to a bus 21 with respect to a reference or ground bus 22. Signals from the amplifier and limiter 19 of FIG. 1 are applied through a capacitor C11 to the base of an NPN type transistor Q1. The base of the transistor Q1 is provided with a bias voltage supplied by a negative temperature coefficient resistor R10, a resistor 25, a diode D1, and a resistor R12 connected in series between the buses 21, 22; and by a resistor R11 connected between the bus 21 and the base of the transistor Q1. The transistor Q1 serves as an amplifier and detector. These amplified and detected signals are derived at the collector of the transistor Q1 and applied through a capacitor C15 to the base of a PNP type transistor Q2.

The transistor Q2 serves as a switch in response to the differentiated output from the transistor Q1. The base of the transistor Q2 is biased by resistors R15, R16 coupled in series between the buses 21, 22. Output signals are derived from the collector of the transistor Q2 and applied through a capacitor C17 to the base of an NPN type transistor Q3.

The transistor Q3 serves as a switch in response to the differentiated output from the transistor Q2. Output signals are derived from the junction of the collector-resistors R20, R21 and applied to the base of a PNP type transistor Q4 which serves to shape the pulses derived from the transistor Q3. The blanking pulses are derived from the collector of the transistor Q4 and applied to the control input 18 of the blanking switch 15. The three transistors Q2, Q3, Q4 cooperate to shape the output pulse.

Generally, the diode D1 provides an amplitude threshold for the amplified and limited signals. The capacitor C15 and resistors R15, R16; and the capacitor C17 and the resistor R19 provide RC timing or differentiating circuits that determine the rate of rise required for the detected pulses to produce a blanking pulse. If the detected pulses rise at a slower rate than set by the RC timing circuits, then a blanking pulse will not be produced.

The circuit of FIG. 2 has been constructed and operated with components having the following values:

| Component | Value |
| --- | --- |
| Capacitor C11 | 0.033 microfarad |
| Capacitor C12 | 0.068 microfarad |
| Capacitor C13 | 470 micromicrofarads |
| Capacitor C15 | 470 micromicrofarads |
| Capacitor C16 | 10 microfarads |
| Capacitor C21 | 15 micromicrofarads |
| Capacitor C17 | 470 micromicrofarads |
| Capacitor C18 | 820 micromicrofarads |
| Capacitor C19 | 4700 micromicrofarads |
| Capacitor C20 | 10 microfarads |
| Resistor R10 | 10,000 ohms negative temperature coefficient |
| Resistor R11 | 33000 ohms |
| Resistor R12 | 100 ohms |
| Resistor R13 | 5600 ohms |
| Resistor R14 | 75 ohms |
| Resistor R15 | 1800 ohms |
| Resistor R16 | 2200 ohms |
| Resistor R17 | 8200 ohms |
| Resistor R18 | 220 ohms |
| Resistor R19 | 10000 ohms |
| Resistor R20 | 560 ohms |
| Resistor R21 | 680 ohms |
| Resistor R22 | 68 ohms |
| Resistor R23 | 10000 ohms |
| Resistor R24 | 1000 ohms |
| Resistor R25 | 12000 ohms |
| Transistor Q1 | 2N3904 |
| Transistor Q2 | 2N3906 |
| Transistor Q3 | 2N3904 |
| Transistor Q4 | 2N3906 |

With a voltage supply B+ of 8.5 volts, this circuit responded to amplitude and limited signals which exceeded a threshold change of approximately 20 millivolts, and which rose at a rate that exceeded 1 volt per millisecond. The blanking pulse had a time duration of approximately 5 microseconds, which blanks a typical noise pulse. However, if information signals are applied to generate a blanking pulse, the information signals are blanked for only a short duration, after which no further blanking pulses are produced as long as the information signals continue at a level that provides full amplitude limiting. Furthermore, no blanking pulses will be produced at all if, as frequently as occurs, the information signals rise at a sufficiently low rate so that the timing circuits do not cause a blanking signal or pulse to be produced. Thus, my blanking circuit permits blanking pulses to be produced in response to rapidly rising noise pulses, but does not produce blanking pulses in response to relatively slow rising information signals.

It will thus be seen that I have provided a new and improved blanking circuit which responds to each noise burst, whether low level or high level noise bursts. My circuit still permits slow rising high level information signals to be utilized without blanking, or fast rising high level information signals to be utilized after a short blanking period. While I have shown only one embodiment, persons skilled in the art will appreciate the modifications which can be made to this one embodiment. For example, the limiting level may be set or adjusted as desired, and likewise the change of amplitude and rate threshold levels can be set or adjusted as desired. I prefer that these parameters be optimized so that blanking will not occur on internally generated thermal noise any more than necessary, and so that thermal noise superimposed on the envelope of a strong desired signal that is at or near limiting will also not cause blanking. The limiting level should be adjusted within the confines of circuit parameters such that a desired signal barely into limiting would not be severely degraded by external noise pulses if blanking were not to occur. And persons skilled in the art will appreciate the various types of circuits which can be used in the blocks 14, 15, 19. All of these circuits are well known in the art, and need not be described in detail. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An improved noise blanker for a radio signal receiver or the like comprising:
   a. input means for said signal;
   b. a time delay circuit having an input coupled to said input means and having an output;
   c. switching means having a signal input coupled to said time delay output, having a signal output, and having a control input;
   d. amplifier means having an input coupled to said input means and having an output;
   e. a limiter having an input coupled to said amplifier output and having an output, said limiter producing an output signal that is limited to a predetermined maximum level;
   f. a threshold circuit having an input coupled to said limiter output and having an output, said threshold circuit producing an output signal only in response to an output signal from said limiter that exceeds a predetermined threshold level in less than a predetermined time;
   g. a pulse circuit having an input coupled to said threshold circuit output and having an output, said pulse circuit producing an output signal of predetermined time duration in response to said threshold circuit output signal;
   h. and means coupling said pulse circuit output signal to said control input of said switching means for preventing signals applied to said signal input of said switching means from reaching said output of said switching means during said predetermined time duration of said pulse circuit output signal.

2. The improved noise blanker of claim 1, and further comprising an amplitude detector coupled between said output of said limiter and said input of said threshold circuit.

3. The improved noise blanker of claim 1 wherein said predetermined threshold level is slightly less than said predetermined maximum level.

4. A method for blanking noise signals present in information signals provided by a receiving device, comprising the steps of:
  a. amplifying the received signals;
  b. limiting the amplitude of the amplified signals;
  c. detecting the amplitude of the limited signals;
  d. providing an output in response to the detected signals exceeding a selected amplitude threshold in less than a predetermined time following the beginning of each detected signal;
  e. generating a pulse of selected time duration in response to the provided output;
  f. and utilizing the pulse to prevent the received signals from being used for the duration of the pulse.

5. An improved noise blanker for a radio signal receiver or the like comprising:
  a. input means for said signal;
  b. a time delay circuit having an input coupled to said input means and having an output;
  c. switching means having a signal input coupled to said time delay output, having a signal output, and having a control input;
  d. amplifier means having an input coupled to said input means and having an output;
  e. a limiter having an input coupled to said amplifier output and having an output, said limiter producing an output signal that is limited to a predetermined maximum level;
  f. a threshold circuit having an input coupled to said limiter output and having an output, said threshold circuit producing an output signal only in response to an output signal from said limiter exceeding a predetermined threshold level and exceeding a predetermined rate of change;
  g. a pulse circuit having an input coupled to said threshold circuit output and having an output, said pulse circuit producing an output signal of predetermined time duration in response to the leading edge of said threshold circuit output signal;
  h. and means coupling said pulse circuit output signal to said control input of said switching means for preventing signals applied to said signal input of said switching means from reaching said output of said switching means during said predetermined time duration of said pulse circuit output signal.

6. The improved noise blanker of claim 5 wherein said predetermined threshold level is slightly less than said predetermined maximum level.

7. A method for blanking noise signals present in information signals provided by a receiving device, comprising the steps of:
  a. amplifying the information signals;
  b. limiting the amplitude of the amplified information signals;
  c. detecting the amplitude of the limited information signals;
  d. producing an output in response to the leading edge of the detected information signals exceeding a selected threshold and exceeding a selected rate of change;
  e. generating a pulse of selected time duration in response to the produced output;
  f. and utilizing the pulse to prevent the information signals from being used for the duration of the pulse.

* * * * *